United States Patent
Riho et al.

(10) Patent No.: US 7,864,618 B2
(45) Date of Patent: Jan. 4, 2011

(54) SEMICONDUCTOR MEMORY DEVICE

(75) Inventors: Yoshiro Riho, Tokyo (JP); Hayato Oishi, Tokyo (JP); Yoshinori Haraguchi, Tokyo (JP); Yoshinori Matsui, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 169 days.

(21) Appl. No.: 12/137,802

(22) Filed: Jun. 12, 2008

(65) Prior Publication Data

US 2009/0003026 A1    Jan. 1, 2009

(30) Foreign Application Priority Data

Jun. 27, 2007    (JP) .............................. 2007-168947

(51) Int. Cl.
*G11C 8/00*    (2006.01)

(52) U.S. Cl. ........................... 365/230.03; 365/230.06; 365/230.08; 365/189.05; 365/210.1

(58) Field of Classification Search ............ 365/230.01, 365/230.06, 230.08, 189.05, 210.1
See application file for complete search history.

(56) References Cited

U.S. PATENT DOCUMENTS 5,586,078 A * 12/1996 Takase et al. .......... 365/230.03
6,041,013 A * 3/2000 Kohno ................... 365/230.03
6,169,699 B1 * 1/2001 Muraoka ............... 365/230.03
6,317,377 B1 * 11/2001 Kobayashi .................. 365/220
2003/0123320 A1 * 7/2003 Wright et al. ............... 365/233

FOREIGN PATENT DOCUMENTS

JP    08-139287    5/1996

* cited by examiner

*Primary Examiner*—Thong Q Le
(74) *Attorney, Agent, or Firm*—Young & Thompson

(57) ABSTRACT

A semiconductor memory device includes a plurality of banks, each of which is constituted of a plurality of memory cell arrays that are aligned in series in the longitudinal direction, wherein each memory cell array includes a plurality of memory cells, and wherein memory cell arrays of banks are collectively aggregated into a plurality of blocks, each of which includes memory cell arrays aligned in the perpendicular direction, in connection with a plurality of DQ pads. DQ pads are arranged in proximity to blocks. Substantially the same distance is set between memory cells and DQ pads so as to reduce dispersions in access times with respect to all DQ pads, thus achieving high-speed access in the semiconductor memory device. The wiring region of IO lines is reduced in the center area of the chip.

13 Claims, 13 Drawing Sheets

SEMICONDUCTOR MEMORY DEVICE

BACKGROUND OF THE INVENTION

1. Field of the Invention

The present invention relates to semiconductor memory devices ensuring high-speed access therefor.

This application claims priority on Japanese Patent Application No. 2007-168947, the content of which is incorporated herein by reference.

2. Description of the Related Art

In conventionally-known semiconductor memory devices, multiple bonding pads (simply referred to as pads) are formed in the peripheries of regions forming memory cells in chips. Pads are connected to terminals of packages of semiconductor memory devices via bonding wires, thus performing transmission and reception of signals with external devices.

In order to achieve high-speed access of memory cells, memory cell arrays are divided into multiple banks, thus increasing the speed for reading and writing data with memory cells.

The aforementioned structure may increase access speed in reading and writing data with individual memory cells; however, it increases wire drawing lengths with respect to wires connecting between banks and pads in the peripheries. That is, it becomes difficult to further increase access speeds above prescribed thresholds.

For this reason, the conventional technology uses the center pad method in which pads are linearly aligned in centers of chips.

In the case of the center pad method, circuits for controlling memory cell arrays are concentrated at centers of chips so that wiring densities thereof become high; hence, it is very difficult to form wirings efficiently.

Various documents such as Patent Document 1 teach solutions to the aforementioned drawback, in which data input/output pads, power pads, and address pads are appropriately arranged in connection with wires so as to provide efficient wirings in semiconductor memory devices.

Patent Document 1: Japanese Unexamined Patent Application Publication No. H08-139287

FIG. 13 shows a chip of a semiconductor memory device disclosed in Patent Document 1, in which four banks 01 to 04 are arranged in respective regions and in which multiple pads are arranged in such a way that data input/output pads (i.e. DQ pads) are collectively arranged in the left of the center area, while command pads and address pads are collectively arranged in the right of the center area.

Since the DQ pads are collectively arranged in proximity to the banks 01 and 02, it is necessary to use relatively long IO buses for inputting and outputting data with the other banks 03 and 04.

In the case of FIG. 13, IO buses have lengths substantially matching half or more of the long sides of the chip, wherein in consideration of buses connected with data amplifiers (DA), memory cells of the other banks 03 and 04 must be connected to DQ pads via relatively long lengths therebetween.

The aforementioned semiconductor device suffers from a problem in that access times of data deviate in connection with respective banks, wherein the access time for outputting data from certain bank via DQ pads with the longest distance therebetween is regarded as the performance of a product. This degrades high-speed access of a semiconductor memory device.

SUMMARY OF THE INVENTION

It is an object of the present invention to provide a semiconductor memory device, which is designed to reduce dispersions of access times by setting uniform distances between memory cells and DQ pads, thus achieving high-speed access. Herein, a wiring region of IO lines is reduced in the center area of a chip.

The present invention is directed to a semiconductor memory device including a plurality of banks, each of which is constituted of a plurality of memory cell arrays that are aligned in series in the longitudinal direction, wherein each memory cell array includes a plurality of memory cells, and wherein memory cell arrays of banks are collectively aggregated into a plurality of blocks, each of which includes memory cell arrays aligned in the perpendicular direction, in connection with a plurality of DQ pads.

The DQ pads are used for testing in reading and writing data with memory cells, wherein the number of DQ pads is identical to the number of bit line pairs with respect to each block. The DQ pads are arranged in proximity to each block. Each memory cell array included in each block has its own address, by which it is accessed via the corresponding DQ pad.

In the above, the DQ pads included in each block are formed in the peripheral region(s). In addition, the semiconductor memory device further includes a plurality of write amplifiers for writing data into memory cells via bit lines, and a plurality of data amplifiers for amplifying data read from memory cells via bit lines. Furthermore, each memory cell array including memory cells further includes a plurality of sense amplifiers for amplifying data read from memory cells via bit lines, and a plurality of Y switches for switching data from sense amplifiers to data amplifiers.

A controller is formed in the center area of a chip of the semiconductor memory device so as to produce control signals such as drive commands for driving data amplifiers. The lengths of the paths for transmitting drive commands between blocks substantially match the lengths of the paths for transmitting data to data amplifiers via bit lines.

A plurality of buffers is arranged approximately in the center position between banks so as to transmit control signals of the controller to blocks. Herein, substantially the same distance is set between the controller and each buffer in the longitudinal direction. Substantially the same distance is set between each buffer and each data amplifier.

IO lines connected between sense amplifiers, write amplifiers, and data amplifiers with respect to memory cell arrays are formed in the uppermost wiring layer of the semiconductor memory device. DOUT lines connected between data amplifiers and DQ pads with respect to memory cell arrays are also formed in the uppermost wiring layer of the semiconductor memory device.

Substantially the same length is set to all the IO lines laid between memory cells and DQ pads, thus setting prescribed timings for outputting data with respect to all DQ pads. Thus, it is possible to reduce dispersions of access times among DQ pads; hence, it is possible to achieve high-speed access with the semiconductor memory device.

Since DQ pads are arranged in proximity to blocks, it is unnecessary to transmit data from far-side memory cells to data amplifiers. In other words, it is unnecessary to draw an IO bus bundling IO lines, which is required in the conventionally-known semiconductor memory device. That is, it is possible to efficiently arrange wirings approximately in the center area of the chip.

The present invention copes with the recent tendency in which semiconductor memory devices are advanced in terms of fine structure, wherein it can easily increase the number of DQ pads (e.g. 64 and 128), thus achieving a high data transfer rate.

BRIEF DESCRIPTION OF THE DRAWINGS

These and other objects, aspects, and embodiments of the present invention will be described in more detail with reference to the following drawings, in which.

DESCRIPTION OF THE PREFERRED EMBODIMENTS

The present invention will be described in further detail by way of examples with reference to the accompanying drawings.

1. First Embodiment

Figure 1:
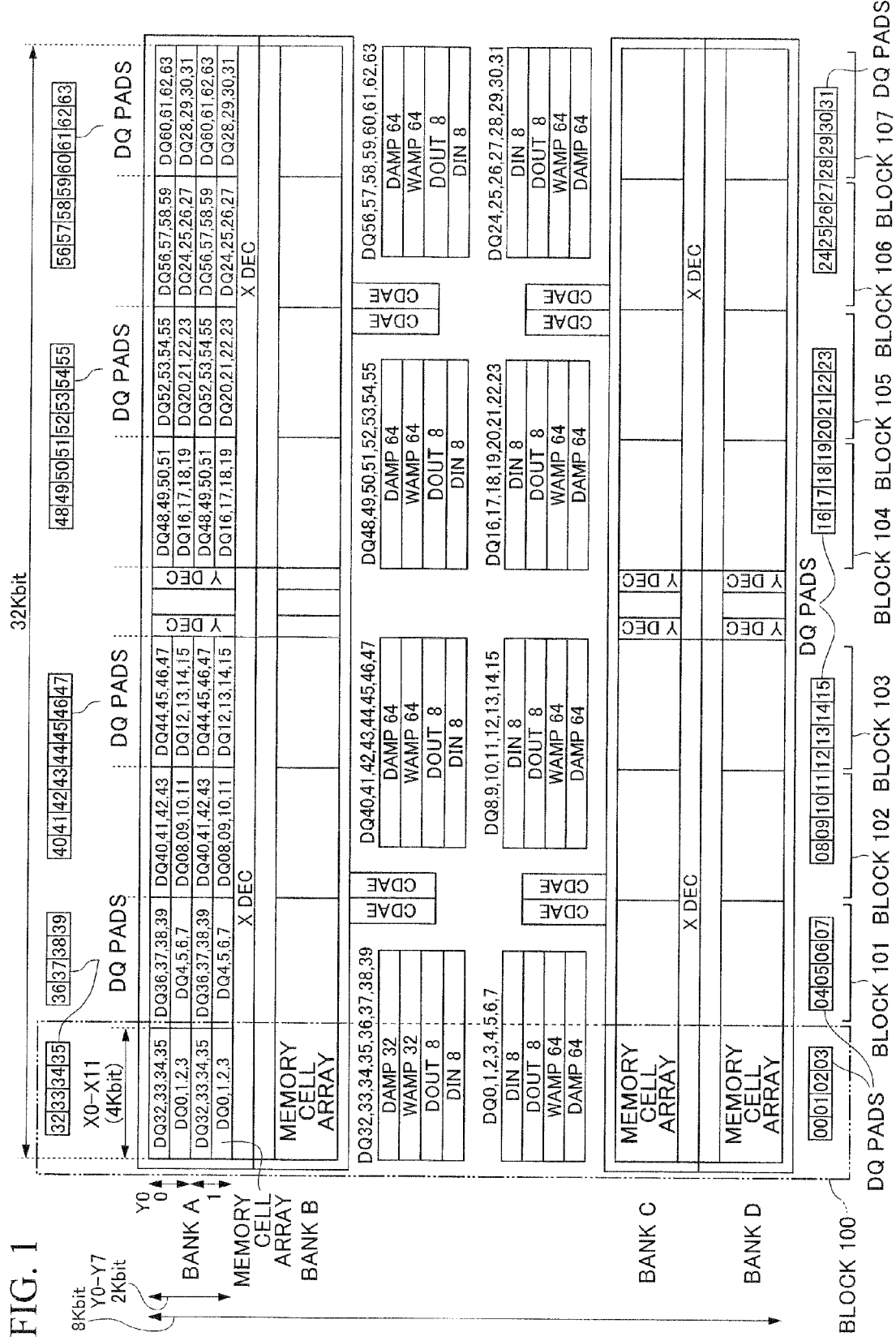
FIG. 1 is an illustration showing the constitution of a semiconductor memory device in accordance with a first embodiment of the present invention.

A semiconductor memory device will be described in detail in accordance with a first embodiment of the present invention with reference to FIGS. 1 to 7. FIG. 1 is a block diagram showing the constitution of the semiconductor memory device of the first embodiment, which has a double data rate (DDR) configuration constituted of memory cells of 256 megabits×64 (i.e. 64 DQ pads).

The semiconductor memory device is divided into four banks, namely banks A, B, C, and D, each of which is constituted of memory cells of 64 megabits. Each bank has a rectangular shape, which is elongated from one end to the other end of a chip. That is, the four banks A, B, C, and D are aligned perpendicular to the longitudinal directions thereof.

Each of the four banks A, B, C, and D is divided into eight memory cell arrays in units of eight DQ pads, i.e. 64 DQ pads are divided by eight so as to form eight blocks. Eight memory cell arrays are aligned in series in the longitudinal direction of each bank. Four memory cell arrays included in the respective four banks A, B, C, and D (each encompassed by solid lines in FIG. 1) are combined together to form a block. In FIG. 1, a block 100 (encompassed by dashed lines) is defined using four memory cell arrays of the respective banks A to D, which are aligned perpendicular to the longitudinal direction. Similarly, blocks 101 to 107 are each defined using other four memory cell arrays of the respective banks A to D, which are aligned perpendicular to the longitudinal direction.

That is, the semiconductor memory device of FIG. 1 has a matrix configuration of memory cell arrays, in which eight memory cell arrays are aligned in each row corresponding to the longitudinal direction with respect to each of four banks A to D, while four memory cell arrays of the respective four banks A to D are aligned in each column perpendicular to the longitudinal direction so as to form each block.

Figure 2:
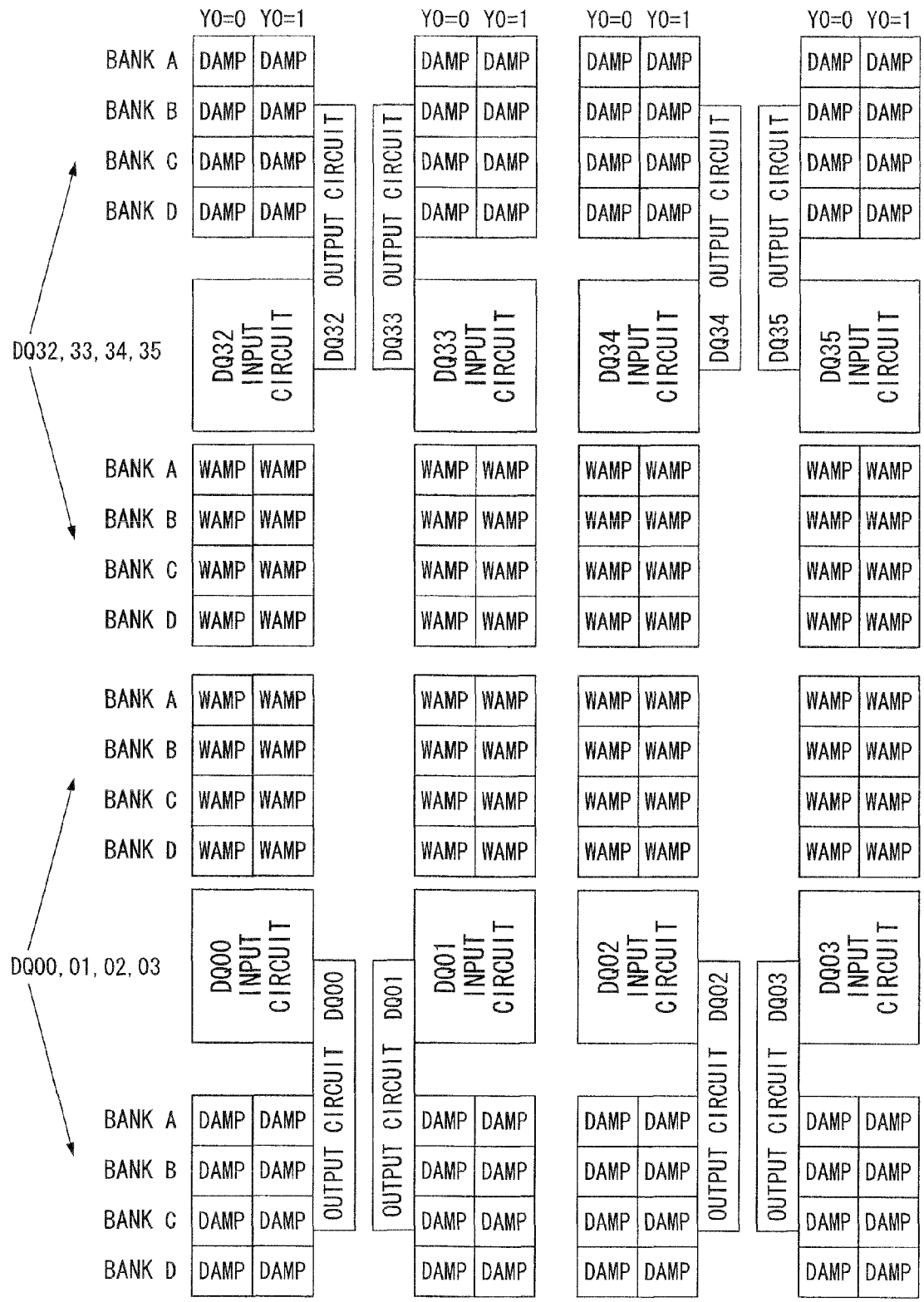
FIG. 2 is an illustration showing the details of a block 100 constituted of four memory cell arrays of respective four banks A to D shown in FIG. 1.

Eight DQ pads are arranged in proximity to each block. As shown in FIG. 2, each block has output circuits for outputting data from DQ pads in read operations and input circuits for inputting data into DQ pads in write operations. FIG. 2 is an illustration showing the details of the block 100. The number of DQ pads arranged for each block will be described later.

In each block, each memory cell array has data amplifiers (DAMP) for amplifying data that are read via bit lines and write amplifiers (WAMP) for amplifying data that are written via bit lines in connection with DQ pads.

The DQ pads are arranged in peripheral portions of the chip of the semiconductor device outside of the memory cell arrays in proximity to both sides of the blocks 100 to 107.

In FIG. 1, four DQ pads DQ00, DQ01, DQ02, and DQ03 are formed in a lower region while four DQ pads DQ32, DQ33, DQ34, and DQ35 are formed in an upper region in connection with the block 100. Similarly, four DQ pads DQ04, DQ05, DQ06, and DQ07 are formed in a lower region while four DQ pads DQ36, DQ37, DQ38, and DQ39 are formed in an upper region in connection with the block 101. Four DQ pads DQ08, DQ09, DQ10, and DQ11 are formed in a lower region while four DQ pads DQ40, DQ41, DQ42, and DQ43 are formed in an upper region in connection with the block 102. Four DQ pads DQ12, DQ13, DQ14, and DQ15 are formed in a lower region while four DQ pads DQ44, DQ45, DQ46, and DQ47 are formed in an upper region in connection with the block 103.

In addition, four DQ pads DQ16, DQ17, DQ18, and DQ19 are formed in a lower region while four DQ pads DQ48, DQ49, DQ50, and DQ51 are formed in an upper region in connection with the block 104. Four DQ pads DQ20, DQ21, DQ22, and DQ23 are formed in a lower region while four DQ pads DQ52, DQ53, DQ54, and DQ55 are formed in an upper region in connection with the block 105. Four DQ pads DQ24, DQ25, DQ26, and DQ27 are formed in a lower region while four DQ pads DQ56, DQ57, DQ58, and DQ59 are formed in an upper region in connection with the block 106. Four DQ pads DQ28, DQ29, DQ30, and DQ31 are formed in a lower region while four DQ pads DQ60, DQ61, DQ62, and DQ63 are formed in an upper region in connection with the block 107.

Each of eight memory cell arrays forming each block is constituted of multiple memory cells for storing data input and output via DQ pads. Memory cells have respective addresses accessed via the corresponding DQ pads.

In FIG. 2, each block includes multiple DQ pads, output circuits and input circuits connected to DQ pads, and data amplifiers (DAMP) and write amplifiers (WAMP) in connection with memory cell arrays.

Each block has the aforementioned structure allowing data to be inputted into and output from respective memory cells; hence, it is unnecessary to form an IO bus region in the center of the chip. This allows data to be inputted into and output from memory cells by way of input circuits and output circuits via short paths.

Figure 3:
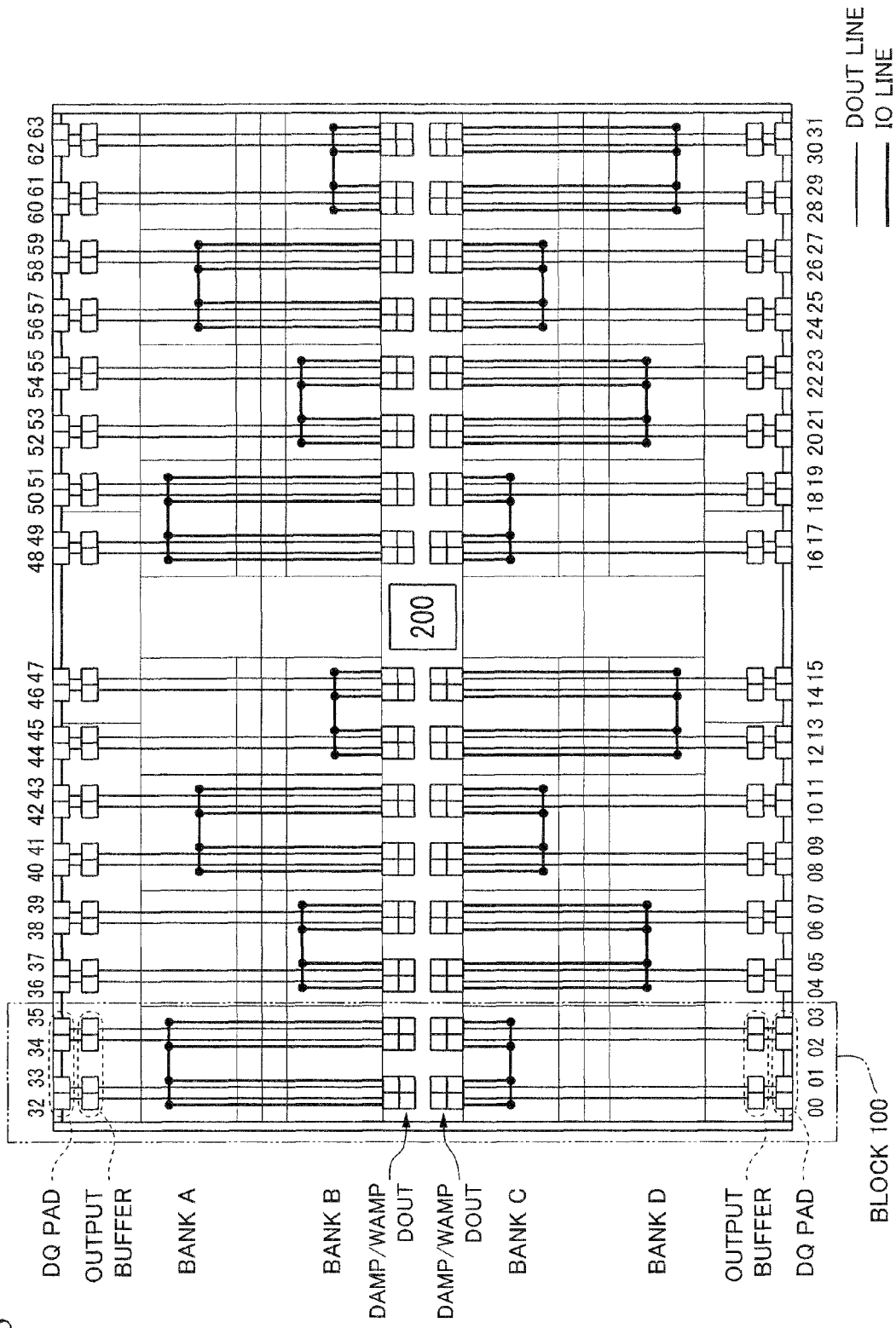
FIG. 3 is an illustration showing IO lines and DOUT lines formed in an uppermost wiring layer of the semiconductor memory device.

As shown in FIG. 3, IO lines used for outputting data via bit lines are wired perpendicular to bit lines and are formed in an uppermost wiring layer. The semiconductor memory device of the present embodiment has three aluminum (Al) wiring layers, wherein IO lines are formed by way of the uppermost aluminum wiring layer and are connected to bit lines as well as data amplifiers (DAMP) and write amplifiers (WAMP) (both connected to bit lines).

IO switches (which will be described later) used for outputting data to amplifiers via bit lines as well as data amplifiers (DAMP) and write amplifiers (WAMP) are arranged in proximity to IO lines, which are laid in parallel with the alignment direction of the banks A to D.

DOUT lines are laid in the uppermost wiring layer perpendicularly to bit lines in connection with DQ pads via input circuits and output circuits.

That is, input circuits and output circuits as well as DQ pads are arranged in proximity to DOUT lines, which are laid in parallel with the alignment direction of the banks A to D.

As described above, the semiconductor memory device of the present embodiment is characterized in that IO lines and DOUT lines are linearly laid with short distances therebetween in connection with respective DQ pads. This eliminates the necessity of forming an IO bus bundling IO lines (which may be laid with relatively long distances from banks) between banks. Thus, it is possible to eliminate a useless wiring region which may be elongated in the longitudinal direction of the chip of the semiconductor memory device.

In write operations, data input via DQ pads are forwarded to input circuits via DOUT lines; then, they are transmitted onto bit lines via IO lines; thus, they are written into memory cells of designated addresses.

In read operations, data are read from memory cells of designated addresses and are output onto bit lines; then, they are amplified by data amplifiers (DAMP), which are connected to bit lines via IO lines; thus, amplified data are transmitted to DQ pads by way of output buffers via DOUT lines. At this time, circuits CDAE enable data amplifiers (DAMP) (e.g. buffers 307A, 307C, 308A, and 308C, see FIG. 6).

Data amplifiers (DAMP) and write amplifiers (WAMP) as well as input circuits and output circuits (or input/output circuits) are arranged in the center portions of blocks and are aligned in the center portion of the chip sandwiched between the banks. Due to this structure, the first distance lying between each amplifier and each input/output circuit in an uppermost memory cell array substantially matches the second distance lying between each amplifier and each input/output circuit in a lowermost memory cell array with respect to each block. This makes it possible to set uniform lengths with respect to DOUT lines and IO lines in each block.

That is, the present embodiment can set substantially the same access time for inputting and outputting data via each DQ pad. In other words, the present embodiment differs from the conventionally-known semiconductor memory device having deviations of access times, in which the longest access time regarding the farthest DQ pad defines the final access time; that is, the present embodiment can achieve high-speed access in reading and writing data via DQ pads.

Figure 4:
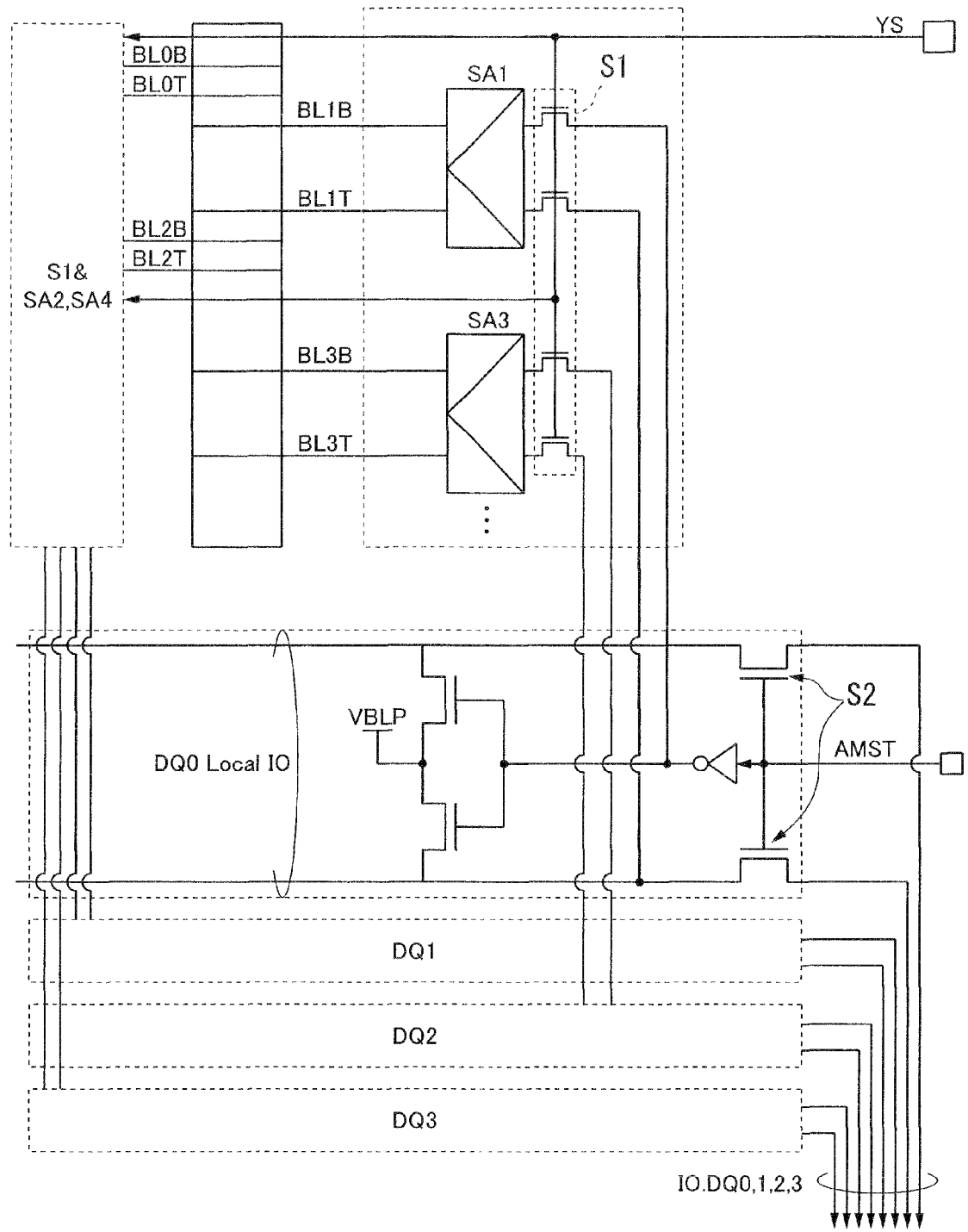
FIG. 4 is a circuit diagram showing the relationship between bit lines and IO lines in connection with DQ pads.

FIG. 4 shows the relationship between bit lines (e.g. bit line pairs BL0T/B, BL1T/B, BL2T/B, and BL3T/B) and IO lines in connection with DQ pads (e.g. DQ pads DQ0, DQ1, DQ2, and DQ3) with respect to the block 100.

Each bank includes a Y decoder (or a Y switch S1) configured by multiple MOS transistors. The Y switch S1 is turned on in response to a YS signal that is produced based on a column address, thus connecting the bit line designated by the column address to the corresponding IO line. Data of the designated bit line is output onto a local IO line.

Multiple local IO lines are selected in response to the column address by turning on pass gates S2 (i.e. transistor switches confirmed by MOS transistors, which are arranged in proximity to IO lines) based on a mat select signal AMST (which is produced based on a row address); then, they are connected to IO lines (which are further connected to data amplifiers), thus establishing connections between bit lines and amplifiers. The mat select signal AMST is used to select each of mats divided from each bank.

Sense amplifiers SA1 and SA2 are provided in connection with each bit line pair laid in each bank, wherein they amplify data output onto bit lines connected to memory cells, which are selected by a row decoder XDEC based on the row address.

In the present embodiment, the number of DQ pads in each block is determined to set prescribed combinations of data patterns (ensuring error detection) in testing of reading and writing data with memory cells via adjacently arranged combinations of bit line pairs, e.g. a first combination of bit line pairs BL0T/B and BL1T/B and a second combination of bit line pairs BL2T/B and BL3T/B. Since two bit line pairs are combined together, four bit line pairs are laid in connection with four DQ pads. This is the current number of DQ pads used for testing of data access with respect to each block in the semiconductor memory device.

That is, the current testing is performed generally using four DQ pads; in other words, the number of DQ pads included in each block is set to an integral multiple of four in terms of efficient testing.

In the present embodiment, the number of bit line pairs substantially corresponds to the number of DQ pads in each block; in other words, the total number of DQ pads included in the semiconductor memory device is divided by this number of DQ pads (or its integral multiple) so as to determine the number of blocks.

In the present embodiment, substantially the same length is set to each path used for transmitting data between each memory cell and each DQ pad. In order to perform write operations and read operations at prescribed timings with relatively small skews with respect to all blocks, timing adjustment is performed in a specific manner described below.

Figure 5:
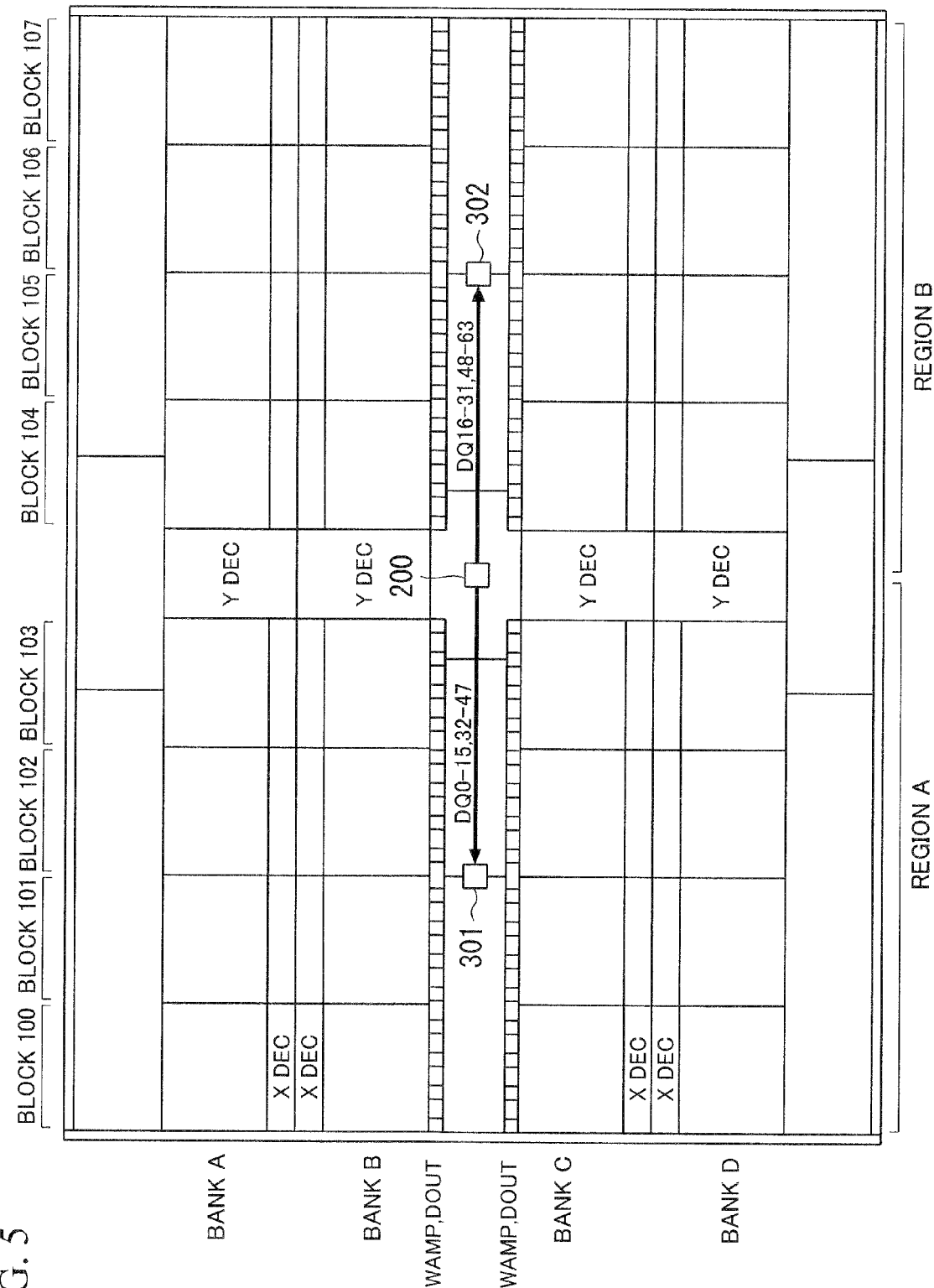
FIG. 5 is an illustration showing the circuitry for supplying write amplifiers and output circuits with drive commands and clock signals in connection with banks and blocks included in the semiconductor memory device.

With reference to FIG. 5, a circuit configuration representing drive timings of write amplifiers (WAMP) and output timings of data from output circuits will be described in connection with blocks. FIG. 5 is a conceptual illustration representative of the circuitry that supplies blocks with drive commands (for driving write amplifiers) and clock signals (activating output circuits).

A controller 200 arranged in the center area of the chip produces drive commands and clock signals based on control signals supplied to signal pads arranged in the periphery of the chip.

Signal pads for inputting control signals such (e.g. RAS, CAS, WE, CE, DQS, and CLK), which are used to produce commands achieving read/write/refresh operations, as well as a power pad applied with electric power driving the circuitry of the chip are arranged in the peripheral region of the chip in association with DQ pads. Address pads (for inputting column addresses and row addresses) are arranged in the peripheral region of the chip in association with DQ pads. Control signals supplied to signal pads are sent to the controller 200 arranged in the center area of the chip.

The controller 200 sends drive commands (for driving write amplifiers) and clock signals (given from an external device, not shown) to buffers 301 and 302, which are distanced from each other in the longitudinal direction.

In FIG. 5, banks A to D each elongated in the longitudinal direction are arranged in parallel with each other in the perpendicular direction, while the blocks 101 to 107 are arranged in the perpendicular direction, wherein the overall circuitry of the chip is horizontally divided into two regions, namely a region A including four blocks 100 to 103 and a region B including other four blocks 104 to 107.

The buffer 301 is located at the center position in the region A so as to send drive commands and clock signals to write amplifiers and output circuits in connection with memory cell arrays of the blocks 100 to 103 included in the region A via signal lines each having substantially the same length. The buffer 301 is positioned in the center area of the chip between the banks B and C in the region A.

Similarly, the buffer 302 is located at the center position of the region B so as to send drive commands and clock signals to write amplifiers and output circuits in connection with memory cell arrays of the blocks 104 to 107 via signal lines each having substantially the same length. Similar to the bank 301, the buffer 302 is positioned in the center area of the chip between the banks B and C in the region B.

In addition, the length of the line connected between the controller 200 and the buffer 301 is substantially identical to the length of the line connected between the controller 200 and the buffer 302.

Furthermore, substantially the same length is set to the lines connected between the buffer 301 and the write amplifiers and output circuits of the blocks 100 to 103 in the region A, while substantially the same length is set to the lines connected between the buffer 302 and the write amplifiers and output circuits of the blocks 104 to 107 in the region B.

The aforementioned structure allows drive commands and clock signals to be sent to write amplifiers and output circuits of blocks at prescribed timings; hence, it is possible to ensure substantially the uniform access time with regard to all DQ pads because substantially the same length of line is set between each memory cell and each DQ pad.

Figure 6:
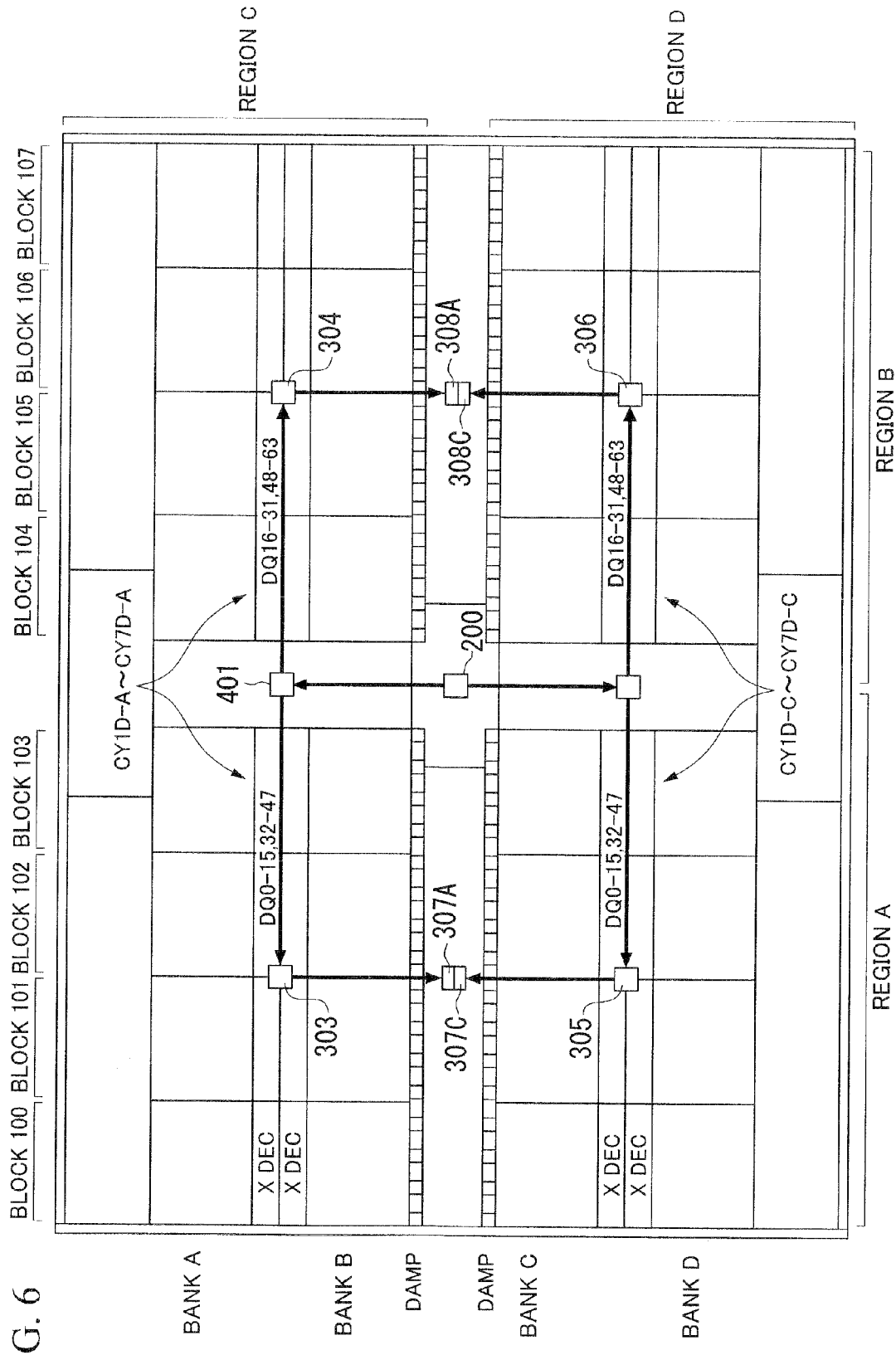
FIG. 6 is an illustration showing the circuitry for supplying data amplifiers with drive commands in connection with banks and blocks included in the semiconductor memory device.

With reference to FIG. 6, a circuit configuration representing drive timings of data amplifiers (DAMP) will be described in connection with blocks.

Similar to drive commands for driving write amplifiers (WAMP), drive commands for driving data amplifiers (DAMP) are produced by the controller 200 (which is arranged in the center area of the chip) based on control signals supplied to signal pads arranged in the peripheral region of the chip.

The controller 200 sends drive commands (for driving data amplifiers (DAMP)) to address control circuits 401 and 402, which are aligned in the perpendicular direction with respect to the controller 200 in FIG. 6.

The overall circuitry of the chip shown in FIG. 6 is vertically divided into two regions, namely a region C including the banks A and B and a region D including the banks C and D with respect to the center area of the chip.

The address control circuit 401 is arranged substantially in the center of the region C so as to output YS signals (i.e. CY1D_A to CY7D_A) in synchronization with a control signal CYE_A.

The address control circuit 402 is arranged substantially in the center of the region D so as to output YS signals (i.e. CY1D_C to CY7D_C).

Figure 7:
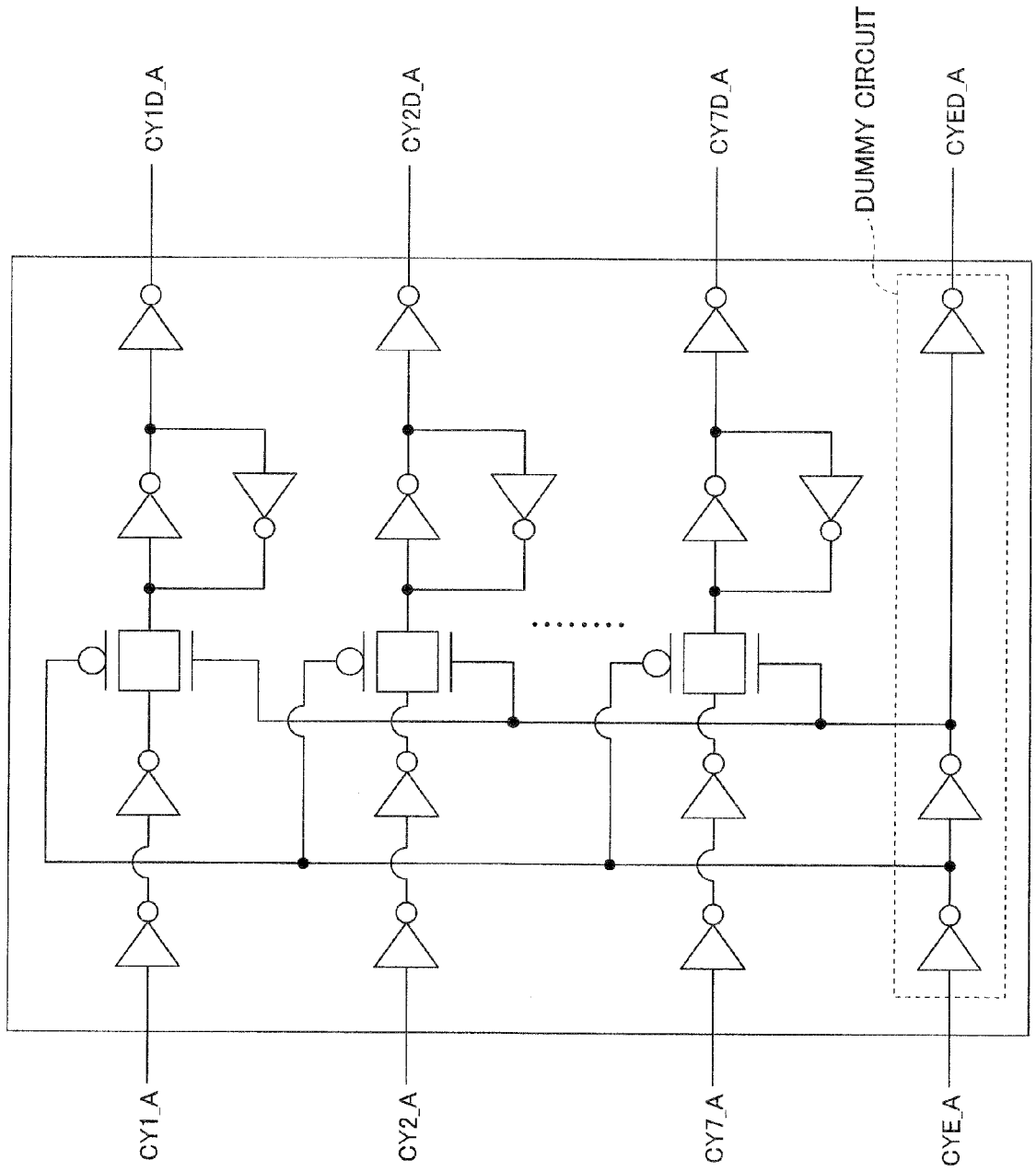
FIG. 7 is a circuit diagram showing the constitution of an address control circuit shown in FIG. 6.

FIG. 7 shows the constitution of the address control circuit 401, which outputs YS signals to Y switches of blocks while outputting a control signal CYED_A defining the timings of outputting YS signals to the buffers 303 and 304 (see FIG. 6).

The address control circuit 401 includes a dummy circuit (the configuration of which is similar to other circuits for controlling YS signals), which outputs the control signal CYED_A (based on the control signal CYE_A) to the buffers 303 and 304.

The dummy circuit imparts substantially the same delay time to the control signal CYED_A as YS signals (i.e. CY1D_A to CY7D_A); then, the control signal CYED_A is sent to the buffer 304 positioned in proximity to IO switches. Thus, the control signal CYED_A is sent to IO switches at the prescribed timing substantially matching the timings for outputting YS signals.

The buffer 303 is arranged substantially at the center position of the region A between the banks A and B within the region C. The buffer 304 is arranged substantially at the center position of the region B between the banks A and B within the region C.

The buffer 303 outputs the control signal CYED_A to a buffer 307A via a line, the length of which substantially matches the length of an IO line, while the buffer 304 outputs the control signal CYED_A to a buffer 308A via a line having a length that substantially matches the length of an IO line.

The buffer 307A forwards the control signal CYED_A to data amplifiers (DAMP) connected to memory cell arrays of the banks A and B included in the blocks 100 to 103, while the buffer 308A forwards the control signal CYED_A to data amplifiers (DAMP) connected to memory cell arrays of the banks A and B included in the blocks 100 to 103.

The constitution of the address control circuit 402 is similar to that of the address control circuit 401 shown in FIG. 7, wherein it outputs YS signals to Y switches of blocks, and it also sends a control signal CYED_C defining the output timings of YS signals to buffers 305 and 306.

The address control circuit 402 includes a dummy circuit which receives a control signal CYE_C so as to produce the control signal CYED_C, which is then supplied to the buffers 305 and 306 in order to control YS signals.

Due to the dummy circuit, the control signal CYED_C is delayed by a prescribed delay time which substantially matches each of delay times applied to YS signals (i.e. CY1D_C to CY7D_C) and is then supplied to the buffer 305 arranged in proximity to IO lines. That is, the control signal CYED_C is transmitted to an IO switch at the prescribed timing substantially identical to the output timings of YS signal.

The buffer 305 is located substantially at the center position of the region A between the banks C and D within the region D. The buffer is located substantially at the center position of the region B between the banks C and D within the region D.

The buffer 305 outputs the control signal CYED_C to the buffer 307C via a line having a length that substantially matches the length of an IO line, while the buffer 306 outputs the control signal CYED_C to the buffer 308C via a line having a length that substantially matches the length of an IO line.

The buffer 307C forwards the control signal CYED_C to data amplifiers (DAMP) connected to memory cell arrays of the banks C and D included in the blocks 100 to 103. The buffer 308C forwards the control signal CYED_C to data amplifiers (DAMP) connected to memory cell arrays of the banks C and D included in the banks 104 to 107.

With respect to all data amplifiers (DAMP) connected to memory cell arrays of the blocks 100 to 107, drive commands for driving data amplifiers are transmitted via paths having lengths that substantially match the lengths of paths used for reading data from memory cells; hence, the timings of supplying data to data amplifiers are synchronized with the drive timings of data amplifiers.

The aforementioned structure determines substantially the same timing for outputting data with respect to all the DQ pads included in the blocks 100 to 107 in read operations. That is, substantially the same length is set to all paths connected between DQ pads and memory cells; hence, it is possible to set substantially the same access time with respect to all DQ pads.

2. Second Embodiment

Next, a semiconductor memory device according to a second embodiment of the present invention will be described with reference to FIGS. 8 and 9, in which parts identical to those shown in FIGS. 1 and 3 are designated by the same reference numerals.

The semiconductor memory device of the second embodiment has a DDR configuration of 256 megabits×32 (i.e. 32 DQ pads).

Figure 8:
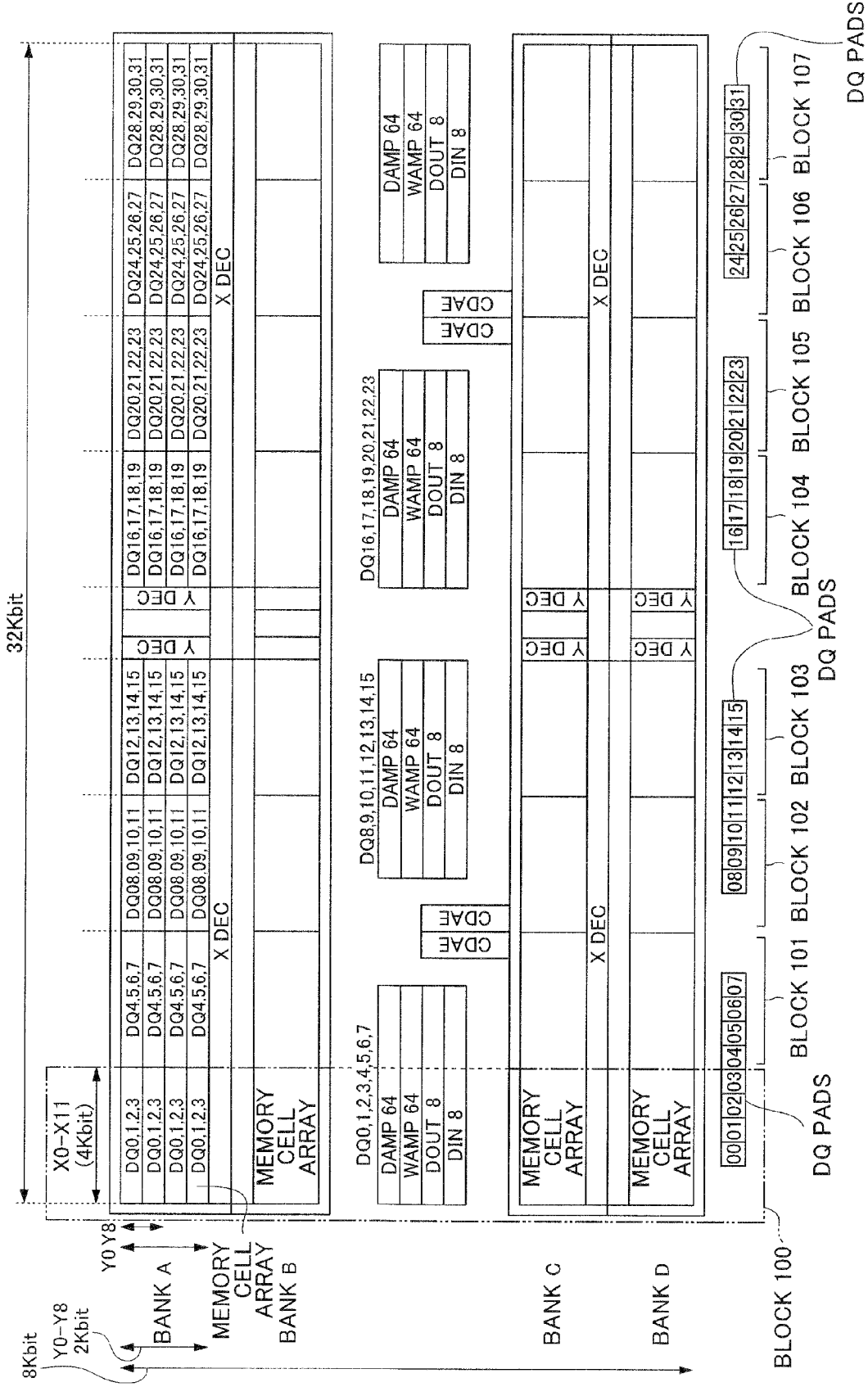
FIG. 8 is an illustration showing the constitution of a semiconductor memory device in accordance with second and third embodiments of the present invention.

Similar to the first embodiment, the overall circuitry of the semiconductor memory device of FIG. 8 is divided into four banks, i.e. banks A, B, C, and D, each of which includes multiple memory cells of 32 megabits. Memory cell arrays of the banks A to D lying in the perpendicular direction are collectively aggregated into eight blocks, namely, blocks 100 to 107. The banks A to D and the blocks 100 to 107 are already described in conjunction with the first embodiment; hence, the detailed descriptions thereof will be omitted.

Four DQ pads are arranged in proximity to each block; hence, similar to the first embodiment, each block has input circuits for writing data into memory cells via DQ pads and output circuits for reading data from memory cells via DQ pads.

Similar to the first embodiment shown in FIG. 2, each block has data amplifiers (DAMP) for amplifying data read from memory cells via bit lines and write amplifiers (WAMP) for amplifying data written into memory cells via bit lines in connection with memory cell arrays.

The semiconductor memory device of the second embodiment shown in FIG. 8 differs from the semiconductor memory device of the first embodiment shown in FIG. 1 in that DQ pads are formed in the lower peripheral region of the chip outside of memory cell arrays in connection with blocks.

That is, the block 100 is connected to DQ pads DQ00, DQ01, DQ02, and DQ03, which are arranged therebelow. The block 101 is connected to DQ pads DQ04, DQ05, DQ06, and DQ07, which are arranged therebelow. The block 102 is connected to DQ pads DQ08, DQ09, DQ10, and DQ11, which are arranged therebelow. The block 103 is connected to DQ pads DQ12, DQ13, DQ14, and DQ15, which are arranged therebelow.

The block 104 is connected to DQ pads DQ16, DQ17, DQ18, and DQ19, which are arranged therebelow. The block 105 is connected to DQ pads DQ20, DQ21, DQ22, and DQ23, which are arranged therebelow. The block 106 is connected to DQ pads DQ24, DQ25, DQ26, and DQ27, which are arranged therebelow. The block 107 is connected to DQ pads DQ28, DQ29, DQ30, and DQ31, which are arranged therebelow.

Similar to the first embodiment, each memory cell array included in each bank and each block is constituted of multiple memory cells for inputting and outputting data via DQ pads. That is, memory cells have their own addresses, which are accessed via DQ pads.

That is, each block includes DQ pads, output circuits, and input circuits, and also includes data amplifiers (DAMP) and write amplifiers (WAMP) with respect to memory cell arrays.

Since each block allows data to be inputted into and output from memory cells, it is unnecessary to arrange an IO bus region in the center of the chip; hence, it is possible to input and output data via short paths by means of input circuits and output circuits.

Figure 9:
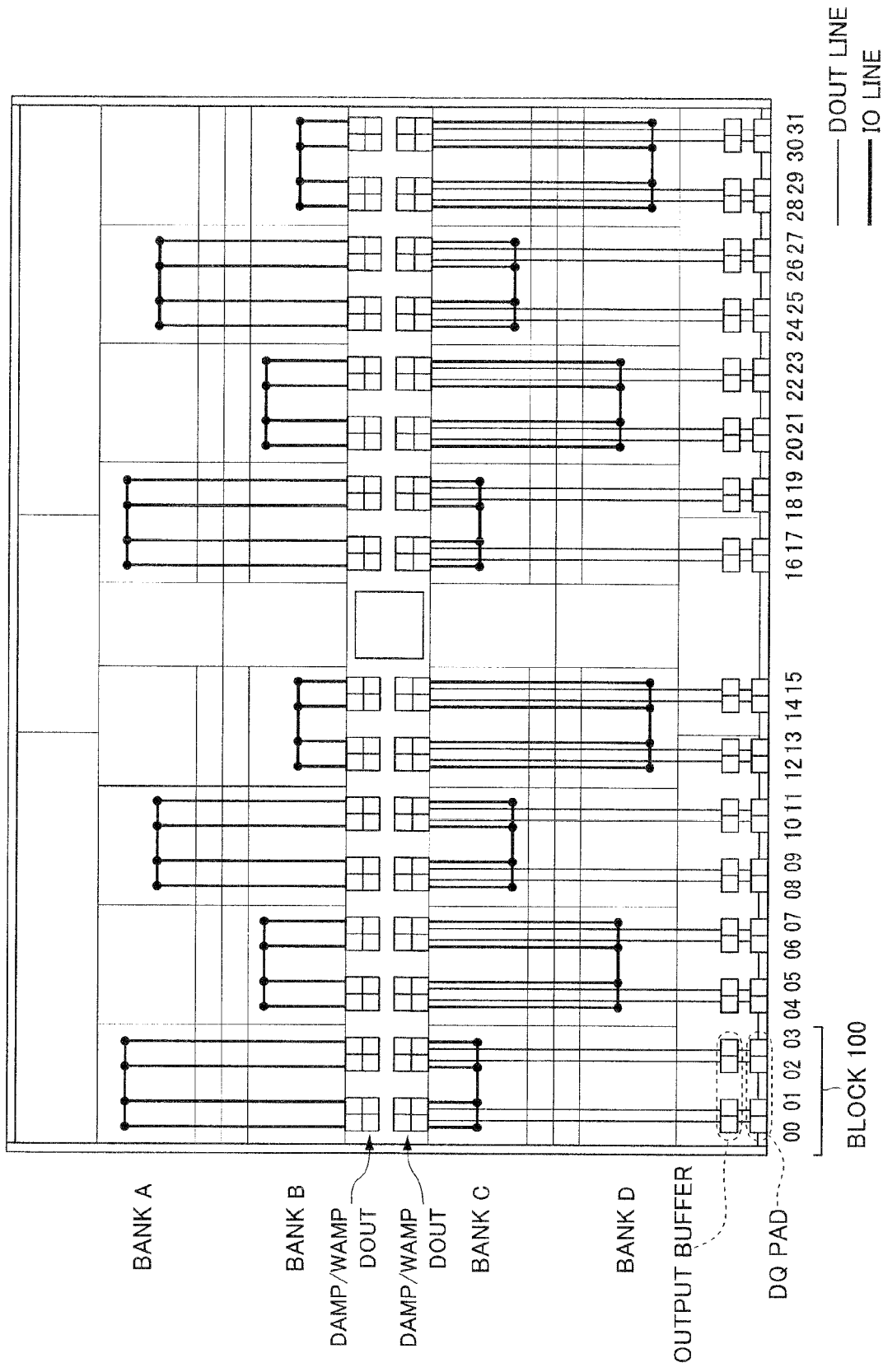
FIG. 9 is an illustration showing IO lines and DOUT lines formed in an uppermost wiring layer of the semiconductor memory device shown in FIG. 8.

As shown in FIG. 9, IO lines used for outputting data from bit lines are laid perpendicular to bit lines and are formed in the uppermost wiring layer of the semiconductor memory device. Similar to the first embodiment, the semiconductor memory device of the second embodiment includes three aluminum wiring layers, wherein IO lines are formed in the uppermost aluminum wiring layer and are connected to bit lines as well as data amplifiers (DAMP) and write amplifiers (WAMP), which are connected to bit lines.

Therefore, IO switches (for outputting data to amplifiers via bit lines) as well as data amplifiers (DAMP) and write amplifiers (WAMP) are arranged in proximity to IO lines, which are laid perpendicular to the banks A to D.

Similar to the first embodiment, DOUT lines are extended from input circuits and output circuits to DQ pads, wherein they are laid perpendicular to bit lines and are formed in the uppermost wiring layer.

Therefore, input circuits and output circuits as well as DQ pads are arranged in proximity to DOUT lines lying in the longitudinal direction of the banks A to D.

Since IO lines and DOUT lines are linearly laid in connection with DQ pads, it is unnecessary to provide an IO bus bundling IO lines connected with barks via relatively long distances between banks; hence, it is possible to eliminate unnecessary wiring regions formed in the longitudinal direction of the chip.

Similar to the first embodiment, the semiconductor memory device of the second embodiment includes the controller 200 and the buffers 301 and 302 as shown in FIG. 5, in which drive commands and clock signals are supplied to write amplifiers (WAMP) and output circuits in connection with blocks at prescribed timings. Since substantially the same length is set to all paths connected between memory cells and DQ pads, it is possible to set substantially the same access time with respect to all DQ pads.

Similar to the first embodiment, the semiconductor memory device of the second embodiment includes the controller 200, the address control circuits 401 and 402, the buffers 303 to 306, and the buffers 307A, 307C, 308A, and 308C shown in FIG. 6. Herein, data are output from DQ pads substantially at the same timing with respect to blocks; substantially the same length is set to all paths connected between memory cells and DQ pads; thus substantially the same access time is achieved with respect to all DQ pads.

3. Third Embodiment

A semiconductor memory device according to a third embodiment of the present invention will be described with reference to FIGS. 8 and 10. The third embodiment is basically identical to the second embodiment in the basic constitution thereof as shown in FIG. 8, wherein it includes four banks, i.e. banks A, B, C, and D that are aligned in the perpendicular direction.

The semiconductor memory device of the third embodiment has a DDR configuration of 512 megabits×64 (i.e. 4 DQ pads).

In the semiconductor device of the third embodiment, each of the banks A to D is divided into sixteen memory cell arrays that are aligned in series in the longitudinal direction. Hence, the semiconductor device of the third embodiment includes sixty-four memory cell arrays, which are divided into sixteen blocks 100 to 115 in the perpendicular direction. In FIG. 10, the block 100 (encompassed by dashed lines) includes four memory cell arrays of the banks A to D aligned in the perpendicular direction.

Four DQ pads are arranged in proximity to each block, which thus includes output circuits for outputting data via DQ pads in read operations and input circuits for inputting data via DQ pads in write operations.

Similar to the first embodiment shown in FIG. 2, each block includes data amplifiers (DAMP) for amplifying data read from memory cells via bit lines and write amplifiers (WAMP) for amplifying data written into memory cells via bit lines in connection with DQ pads with respect to memory cell arrays.

DQ pads are formed in upper and lower peripheral regions of each block outside of memory cell arrays.

Specifically, the block 100 includes DQ pads DQ00 and DQ01 formed in the lower peripheral region and DQ pads DQ32 and DQ33 formed in the upper peripheral region. The block 101 includes DQ pads DQ02 and DQ03 formed in the lower peripheral region and DQ pads DQ34 and DQ35 formed in the upper peripheral region. The block 102 includes DQ pads DQ04 and DQ05 formed in the lower peripheral region and DQ pads DQ36 and DQ37 formed in the upper peripheral region. The block 103 includes DQ pads DQ06 and DQ07 formed in the lower peripheral region and DQ pads DQ38 and DQ39 formed in the upper peripheral region.

Similarly, the block 104 includes DQ pads DQ08 and DQ09 formed in the lower peripheral region and DQ pads DQ40 and DQ41 formed in the upper peripheral region. The block 105 includes DQ pads DQ10 and DQ11 formed in the lower peripheral region and DQ pads DQ42 and DQ43 formed in the upper peripheral region. The block 106 includes DQ pads DQ12 and DQ13 formed in the lower peripheral region and DQ pads DQ44 and DQ45 formed in the upper peripheral region. The block 107 includes DQ pads DQ14 and DQ15 formed in the lower peripheral region and DQ pads DQ46 and DQ47 formed in the upper peripheral region.

In addition, the block 108 includes DQ pads DQ16 and DQ17 formed in the lower peripheral region and DQ pads DQ48 and DQ49 formed in the upper peripheral region. The block 109 includes DQ pads DQ18 and DQ19 formed in the lower peripheral region and DQ pads DQ50 and DQ51 formed in the upper peripheral region. The block 110 includes DQ pads DQ20 and DQ21 formed in the lower peripheral region and DQ pads DQ52 and DQ53 formed in the upper peripheral region. The block 111 includes DQ pads DQ22 and DQ23 formed in the lower peripheral region and DQ pads DQ54 and DQ55 formed in the upper peripheral region.

Furthermore, the block 112 includes DQ pads DQ24 and DQ25 formed in the lower peripheral region and DQ pads DQ56 and DQ57 formed in the upper peripheral region. The block 113 includes DQ pads DQ26 and DQ27 formed in the lower peripheral region and DQ pads DQ58 and DQ59 formed in the upper peripheral region. The block 114 includes DQ pads DQ28 and DQ29 formed in the lower peripheral region and DQ pads DQ60 and DQ61 formed in the upper peripheral region. The block 115 includes DQ pads DQ30 and DQ31 formed in the lower peripheral region and DQ pads DQ62 and DQ63 formed in the upper peripheral region.

Figure 10:
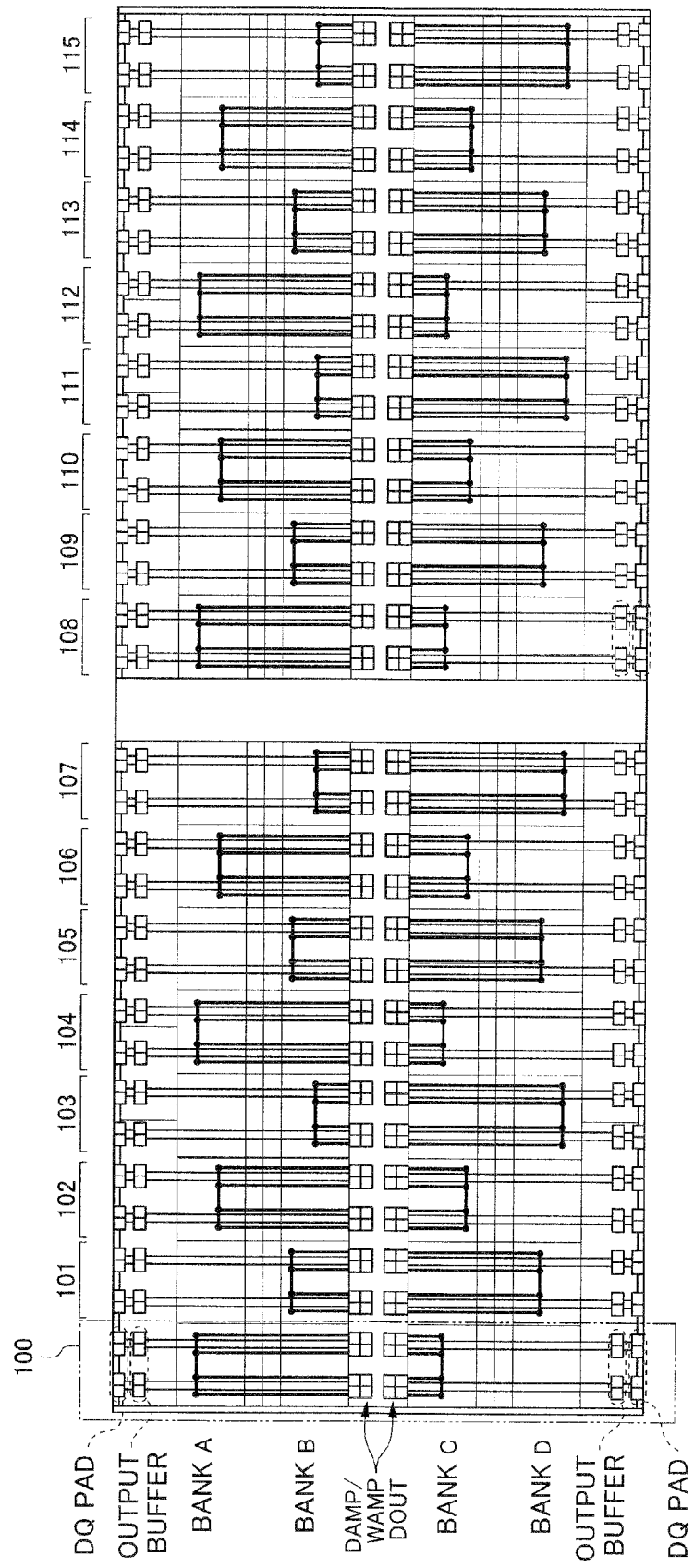
FIG. 10 is an illustration showing IO lines and DOUT lines formed in connection with banks and blocks of the semiconductor memory device of the third embodiment shown in FIG. 8.

As shown in FIGS. 8 and 10, data amplifiers (DAMP), write amplifiers (WAMP), input circuits, and output circuits are formed in the center area of the chip between the blocks A and B and the blocks C and D.

In the aforementioned structure, the first distance between each memory cell, each amplifier, and each of input/output circuits within the uppermost memory cell array of each block is substantially identical to the second distance between each memory cell, each amplifier, and each of input/output circuits within the lowermost memory cell of each block. This makes it possible to set uniform lengths to DOUT lines and IO lines lying between blocks.

Therefore, it is possible to set uniform access times in inputting and outputting data from DQ pads. That is, the third embodiment is advantageous compared with the conventionally-known semiconductor memory device having an access time limited by the longest access time for inputting and outputting data via the farthest DQ pad in that the access time thereof can be reduced.

Figure 11:
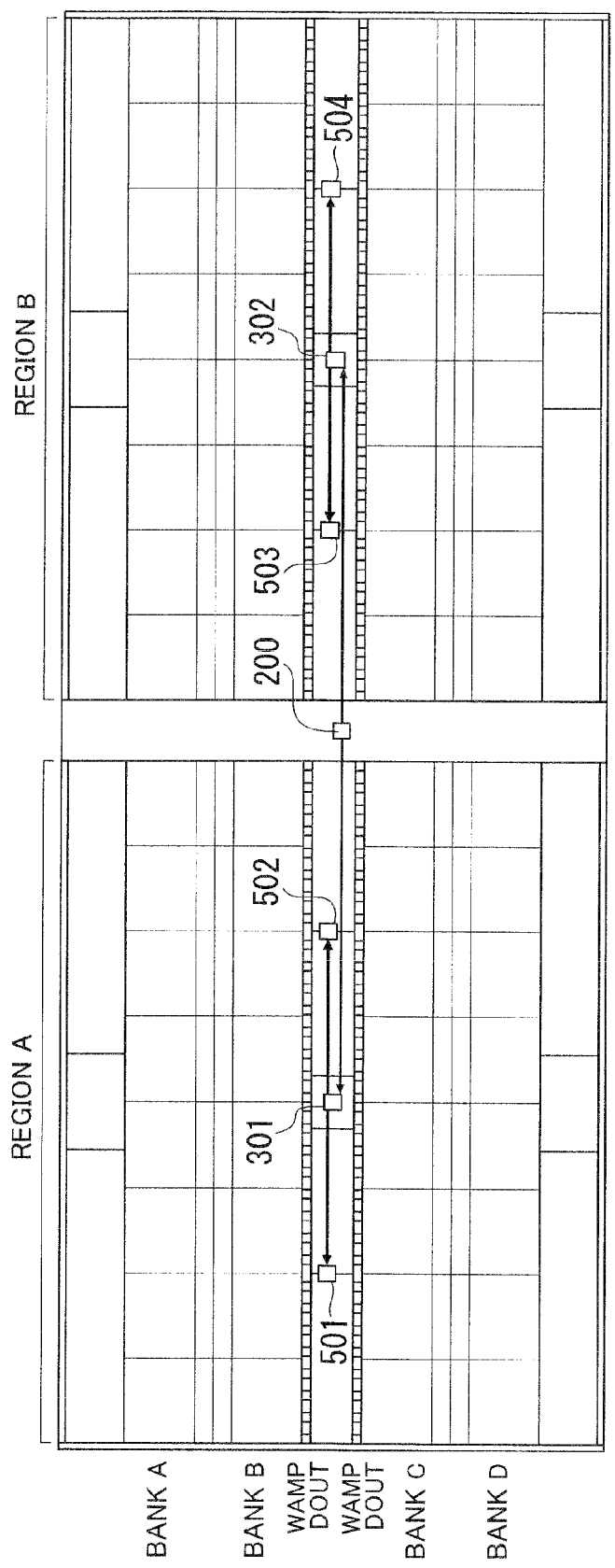
FIG. 11 is an illustration showing the circuitry for supplying drive commands and clock signals to write amplifiers and output circuits in connection with blocks included in the semiconductor memory device of the third embodiment.

Similar to the first embodiment, drive commands and clock signals are supplied to write amplifiers (WAMP) and output circuits included in all blocks of the semiconductor memory device of the third embodiment, which includes the controller 200 and the buffers 301 and 302 as well as buffers 501 to 505 as shown in FIG. 11. This makes it possible to supply drive commands and clock signals to write amplifiers (WAMP) and output circuits included in blocks of the semiconductor memory device at prescribed timings. That is, substantially the same length is set to paths for transmitting data between memory cells and DQ pads; hence, it is possible to set uniform access times with respect to all DQ pads.

Specifically, drive commands and clock signals transmitted to the buffer 301 are forwarded to the buffers 501 and 502, by which they are supplied to write amplifiers (WAMP) and output circuits included in blocks arranged in proximity to the buffers 501 and 502; hence, it is possible to send drive commands and clock signals to write amplifiers and output circuits at prescribed timings.

Figure 12:
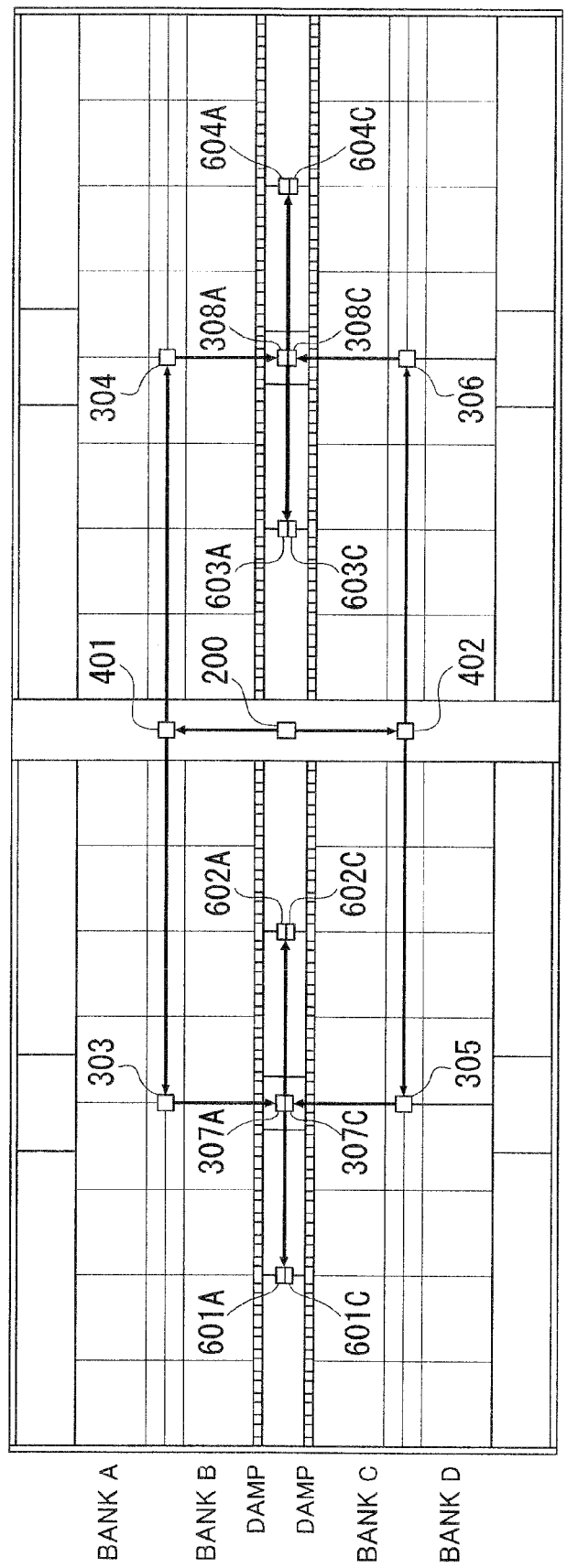
FIG. 12 is an illustration showing the circuitry for supplying drive commands to data amplifiers in connection with blocks included in the semiconductor memory device of the third embodiment.
Figure 13:
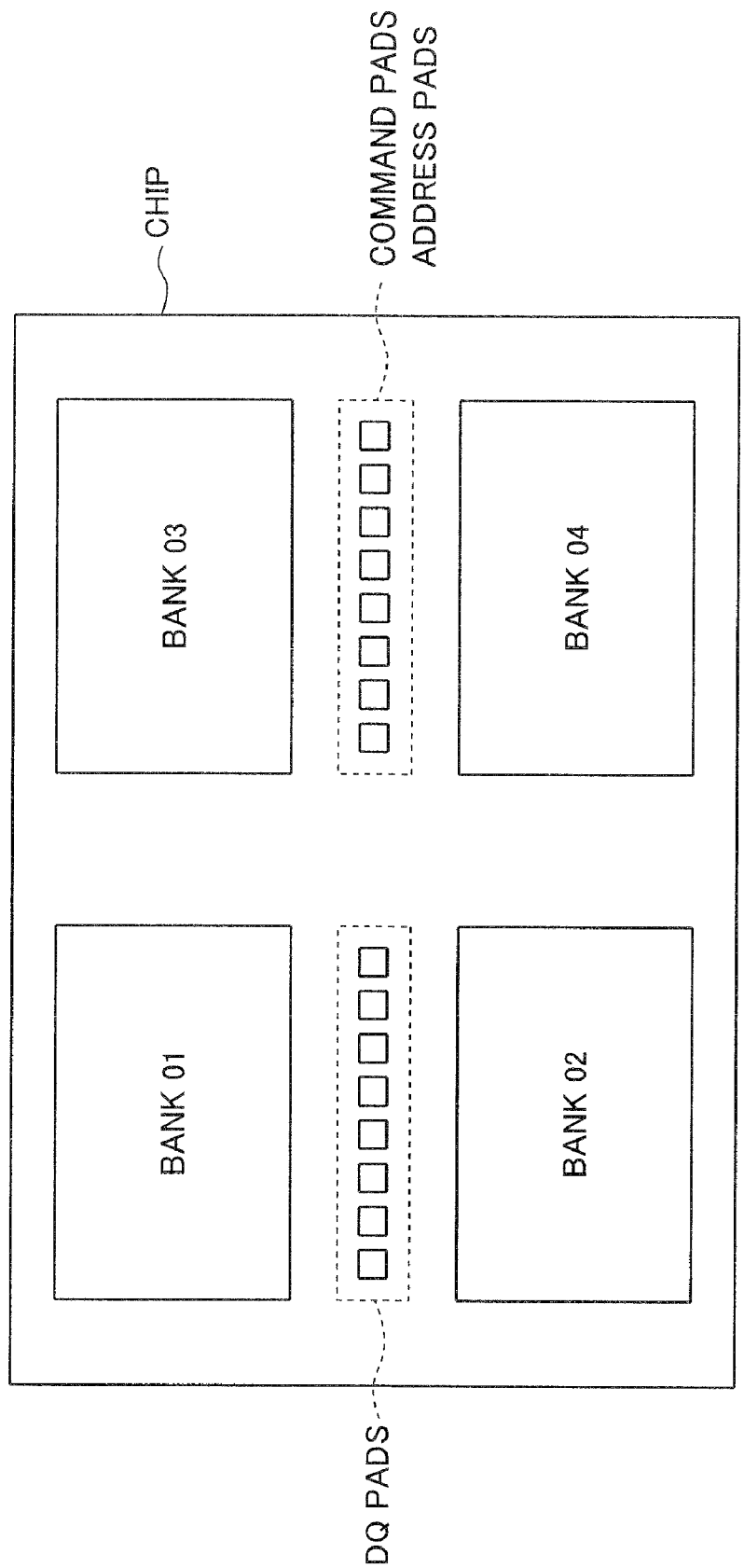
FIG. 13 is an illustration showing a layout of banks and pads in a chip of a conventionally-known semiconductor memory device.

FIG. 12 shows the relationship between data amplifiers (DAMP) and buffers in connection with the banks A to D included in the semiconductor memory device of the third embodiment, wherein, similar to the first embodiment, the control circuit 200, address control circuits 401 and 402, buffers 303 to 306, buffers 307A and 307C and buffers 308A and 308C, and buffers 601A, 601C, 602A, 602C, 603A, 603C, 604A, and 604C are formed in the center area of the chip between the banks A and B and the banks C and D. This makes it possible to set uniform output timings with respect to all DQ pads. That is, substantially the same length is set to all paths connected between memory cells and DQ pads; hence, it is possible to set uniform access times with respect to all DQ pads.

Lastly, the present invention is not necessarily limited to the aforementioned embodiments, which can be further modified in a variety of ways within the scope of the invention as defined in the appended claims.

What is claimed is:

1. A device comprising:
    first and second banks that are elongated in a first direction and substantially parallel to each other;
    each of said first and second banks including a plurality of memory cell arrays that are arranged in line in the first direction, said memory cell arrays forming a plurality of first blocks that each includes one of said memory cell arrays of said first bank and one of said memory cell arrays of said second bank, wherein said one of the memory cell arrays of the first bank and said one of the memory cell arrays of the second bank in each of said first blocks are arranged in a second direction substantially perpendicular to the first direction; and
    a plurality of sets of first DQ pads, each of said sets of first DQ pads being in line with an associated one of said first blocks in the second direction and each of said sets of first DQ pads being electrically connected to said memory cell arrays of the associated one of said first blocks.

2. The device of claim 1, further comprising a plurality of sets of output circuits, each of said sets of output circuits being in line with an associated one of said first blocks and the associated one of said sets of first DQ pads in the second direction and each of said sets of output circuits being electrically coupled to said memory cell arrays of the associated one of the first blocks and to the associated one of said sets of first DQ pads.

3. The device of claim 2, wherein each of said first blocks is between the associated one of the sets of output circuits and the associated one of the sets of first DQ pads.

4. The device of claim 2, further comprising a plurality of sets of first electrical connection lines that are each elongated in the second direction and straight, each of said sets of first electrical connection lines being above an associated one of the first blocks and electrically connected to the associated one of the sets of output circuits and to the associated one of the sets of first DQ pads.

5. The device of claim 2, further comprising:
    third and fourth banks that are elongated in the first direction and substantially parallel to each other;
    each of said third and fourth banks including a plurality of memory cell arrays that are arranged in line in the first direction, said memory cell arrays of said third and fourth banks forming a plurality of second blocks that each includes one of said memory cell arrays of said third bank and one of said memory cell arrays of said fourth bank, wherein said one of the memory cell arrays of the third bank and said one of the memory cell arrays of the fourth bank in each of said second blocks are arranged in the second direction,
    wherein each of said second blocks is in line with an associated one of said output circuits, an associated one of the first blocks, and an associated one of said first DQ pads in the second direction and on an opposite side of the associated one of said first blocks from the associated one of said sets of output circuits, and
    wherein each of said second blocks is electrically connected to the associated one of said sets of first DQ pads.

6. The device of claim 1, further comprising:
    third and fourth banks that are elongated in the first direction and substantially parallel to each other;
    each of said third and fourth banks including a plurality of memory cell arrays that are arranged in line in the first direction, said memory cell arrays of said third and fourth banks forming a plurality of second blocks that each includes one of said memory cell arrays of said third bank and one of said memory cell arrays of said fourth bank, wherein said one of the memory cell arrays of the third bank and said one of the memory cell arrays of the fourth bank in each of said second blocks are arranged in the second direction; and
    a plurality of sets of second DQ pads, each of said sets of second DQ blocks being in line with an associated one of said first blocks, an associated one of said second blocks, and an associated one of said sets of first DQ pads in the second direction and each of said sets of second DQ pads being electrically connected to said memory cell arrays of the associated one of said second blocks,
    wherein said first and second blocks are between the associated ones of said first and second DQ pads.

7. A device comprising:
    a plurality of blocks arranged in a line in a first direction, each of said blocks including first, second, and third regions that are disposed in a second direction substantially perpendicular to the first direction, said second region being between said first and third regions;
    a plurality of sets of DQ pads, each of said sets of DQ pads being in said first region of a different one of said blocks;
    a plurality of first memory cell arrays, each of said first memory cell arrays being in said second region of a different one of said blocks; and
    a plurality of first sets of output circuits, each of said first sets of output circuits being in said third region of a different one of said blocks,
    wherein each of said first sets of output circuits is electrically connected at one end thereof to the one of said sets of DQ pads in the respective one of said blocks and at another end thereof to the one of said first memory cell arrays in the respective one of said blocks.

8. The device of claim 7, further comprising a plurality of sets of first electrical connection lines that are each elongated in the second direction, each of said sets of first electrical connection lines being arranged in a different one of said blocks, wherein, in each of said blocks, each of said sets of first electrical connection lines is between the respective one of said first sets of output circuits and the respective one of said sets of DQ pads.

9. The device of claim 8, wherein, in each of said blocks, each of said sets of first electrical connection lines is above the respective one of said first memory cells.

10. The device of claim 9, wherein the lengths of the longest electrical connection line in each of said plurality of sets of first electrical connection lines are the same.

11. The device of claim 7, wherein each of said blocks further comprises a fourth region that is on a side of said second region opposite said third region,
    the device further comprising,
    a plurality of second memory cell arrays, each of said second memory cell arrays being in said fourth region of a different one of said blocks, and
    a plurality of second sets of output circuits, each of said second sets of output circuits being in said third region of a different one of said blocks,
    wherein each of said second sets of output circuits is electrically connected at one end thereof to the one of said sets of DQ pads in the respective one of said blocks and at another end thereof to the one of said second memory cell arrays in the respective one of said blocks.

12. The device of claim 7, wherein each of said blocks further comprises fourth and fifth regions, said fourth region being on a side of said second region opposite said third region and between said first and third regions, the device further comprising, a plurality of second memory cell arrays, each of said second memory cell arrays being in said fourth region of a different one of said blocks, a plurality of second sets of DQ pads, each of said second sets of DQ pads being in said fifth region of a different one of said blocks, and a plurality of second sets of output circuits, each of said second sets of output circuits being in said third region of a different one of said blocks, wherein each of said second sets of output circuits is electrically connected at one end thereof to the one of said second sets of DQ pads in the respective one of said blocks and at another end thereof to the one of said second memory cell arrays in the respective one of said blocks.

13. A device comprising:

first and second banks that are elongated in a first direction and substantially parallel to each other;

each of said first and second banks including a plurality of memory cell arrays that are arranged in line in the first direction, said memory cell arrays forming a plurality of first blocks that each includes one of said memory cell arrays of said first bank and one of said memory cell arrays of said second bank, wherein said one of the memory cell arrays of the first bank and said one of the memory cell arrays of the second bank in each of said first blocks are arranged in a second direction substantially perpendicular to the first direction;

a plurality of sets of first DQ pads, each of said sets of first DQ pads being in line with an associated one of said first blocks in the second direction and each of said sets of first DQ pads being electrically connected to said memory cell arrays of the associated one of said first blocks;

a plurality of sets of output circuits, each of said sets of output circuits being in line with an associated one of said first blocks and the associated one of said sets of first DQ pads in the second direction and each of said sets of output circuits being electrically coupled to said memory cell arrays of the associated one of the first blocks and to the associated one of said sets of first DQ pads; and a plurality of sets of output buffers, each of said sets of output buffers being in line with an associated one of said first blocks, an associated one of said sets of first DQ pads, and an associated one of said sets of output circuits, and being between the associated one of said first blocks and the associated one of said first DQ pads.

* * * * *